United States Patent
Kakamu et al.

(10) Patent No.: US 6,794,693 B2
(45) Date of Patent: Sep. 21, 2004

(54) SEMICONDUCTOR DEVICE AND MANUFACTURING METHOD THEREOF

(75) Inventors: Katsumi Kakamu, Kasugai (JP); Atsushi Suzuki, Kanagawa (JP); Kiyotaka Tabuchi, Kanagawa (JP)

(73) Assignees: Fujitsu Limited, Kawasaki (JP); Sony Corporation, Tokyo (JP)

( * ) Notice: Subject to any disclaimer, the term of this patent is extended or adjusted under 35 U.S.C. 154(b) by 0 days.

(21) Appl. No.: 10/408,581

(22) Filed: Apr. 8, 2003

(65) Prior Publication Data

US 2004/0041267 A1 Mar. 4, 2004

(30) Foreign Application Priority Data

Aug. 29, 2002 (JP) ........................................ 2002-250933

(51) Int. Cl.[7] ............................................. H01L 23/48
(52) U.S. Cl. .................... 257/257; 750/257; 750/758; 750/760; 750/762; 750/763; 750/764; 750/774
(58) Field of Search ................................ 257/750, 758, 257/760, 762, 763, 764, 774

(56) References Cited

U.S. PATENT DOCUMENTS

| 5,834,840 A | * | 11/1998 | Robbins et al. ............. 257/705 |
| 6,479,380 B2 | * | 11/2002 | Furusawa et al. ........... 438/638 |
| 2003/0205825 A1 | * | 11/2003 | Fujisawa et al. ............ 257/774 |

FOREIGN PATENT DOCUMENTS

| DE | 19930583 A1 | * | 7/1999 | ........... H01L/29/78 |
| JP | 7-131033 | * | 5/1995 | ......... H01L/29/786 |

* cited by examiner

Primary Examiner—Jasmine Clark
(74) Attorney, Agent, or Firm—Westerman, Hattori, Daniels & Adrian, LLP

(57) ABSTRACT

A threshold voltage change and degradation of the drain saturation current over a period of time of a MOS transistor are prevented by providing a permeable insulating film that serves as an inter-layer etching stopper layer on the surface of a plug, and an inter-layer insulating film that can be made from a low dielectric constant organic insulating film.

6 Claims, 5 Drawing Sheets

SEMICONDUCTOR DEVICE AND MANUFACTURING METHOD THEREOF

The present application is based on Japanese priority application No. 2002-250933 filed on Aug. 29, 2002 with the Japanese Patent Office, the entire contents of which are hereby incorporated by reference.

BACKGROUND OF THE INVENTION

1. Field of the Invention

The present invention generally relates to a semiconductor device that contains a MOS (Metal Oxide Semiconductor) transistor, and especially relates to a semiconductor device wherein change of threshold voltage with time and degradation of drain saturation current with time are prevented from occurring.

2. Description of the Related Art

In recent years and continuing, miniaturization of semiconductor elements and multilayer wiring is progressing, resulting in miniaturization of semiconductor devices and high-density integration of the semiconductor elements. Further, improvements in the operating speed of semiconductor devices are required.

However, where wiring width and wiring interval are made narrow for high-density integration, RC delay arises due to increases in wiring resistance (R) and wiring capacitance (C), which set a limit to the improvements of the operating speed.

Then, in order to minimize the RC delay, reduction of the wiring resistance has been practiced, using a dual damascene process (Cu dual damascene process) that uses Cu as the wiring material. The dual damascene process forms a slot for wiring and a contact hole in one body in an inter-layer insulation layer, and embeds Cu in the slot and the contact hole for electrically connecting layers. In this manner, the wiring resistance can be reduced and the RC delay can be reduced by using low resistance Cu, in comparison with the conventional wiring structure using aluminum.

FIG. 1 is a sectional figure showing a MOS device 10 that has a Cu dual damascene structure. With reference to FIG. 1, the MOS device 10 includes a semiconductor substrate 11 of a single conductivity type, for example, an n-type semiconductor substrate, which further includes a device isolation region 12 that is formed by an STI (Shallow Trench Isolation) process, a device region 13 surrounded by the device isolation region 12, a gate insulating film 15 formed at the device region 13 on the semiconductor substrate 11, a gate electrode 16, a side wall insulating film 14 supported by the gate electrode 16, and a source region 20 and a drain region 21 that are composed of an opposite conductivity type dopant ion diffused in the semiconductor substrate 11, a multilayer wiring structure 22 of a Cu dual damascene structure formed on the semiconductor substrate 11, a passivation layer 23, etc.

The multilayer wiring structure 22 further includes a first wiring layer 24, a plug 25 that connects the first wiring layer 24 to a second wiring layer 24 and the gate electrode 16 to the second wiring layer 24, inter-layer insulation layers 26 that insulate the first and the second wiring layers 24, respectively, an etching stopper layer 30 used when forming the wiring layers 24 and the plug 25, a Cu diffusion prevention layer 31, etc.

Here, the inter-layer insulation layer 26 is constituted by a silicon oxide film, a low dielectric constant insulating film, etc. that are formed by the CVD method (chemical vapor deposition) and the like. Further, the etching stopper layer 30 is constituted by a silicon nitride film formed by a sputtering method, the CVD method, and the like.

FIG. 2 is a sectional figure showing a MOS device 40 that includes an aluminum wiring structure 41. With reference to FIG. 2, the aluminum wiring structure 41 includes a wiring layer 42, a plug 43, and an inter-layer insulation layer 44 that surrounds the wiring layer 42 and the plug 43.

In the aluminum wiring structure 41, an etching stopper layer is not prepared on the surface of the inter-layer insulation layer 44, which is different from the multilayer wiring structure 22 of Cu dual damascene. Here, the MOS transistor portion is the same as that of FIG. 1.

With a p-channel MOS transistor that has a Cu dual damascene structure as shown in FIG. 1, there is a problem in that threshold voltage changes with time and drain saturation current degrades with time. Details will be explained below.

FIG. 3 shows degradation with time of the drain saturation current $\Delta Ids$ of the p-channel MOS transistor that has the Cu dual damascene structure as shown in FIG. 1, (indicated as "Cu wiring structure" in FIG. 3) and an aluminum wiring structure as shown in FIG. 2. In FIG. 3, stress time expresses the elapsed time of the MOS transistor being energized. Here, the voltage applied to the gate is a constant.

With reference to FIG. 3, the time for the drain saturation current to be degraded by 5% is considered, which is $3 \times 10^4$ seconds in the case of the aluminum wiring structure, and about $1 \times 10^3$ seconds in the case of the Cu dual damascene structure. That is, the Cu dual damascene structure is more susceptible to the degradation. This phenomenon is called NBTI (Negative Bias Temperature Instability). Specifically, if moisture invades into a gate insulating film, a trap is formed in the gate insulating film, and the trap easily catches an electron hole, which is a carrier. In this manner, the number of carriers that are caught by the trap increases with the progress of the stress time of the MOS transistor, causing the threshold voltage to change with time, and the drain saturation current to decrease with time.

SUMMARY OF THE INVENTION

Accordingly, it is a general object of the present invention to provide a semiconductor device, wherein degradation of the drain saturation current with time of a MOS transistor and change of threshold voltage with time are prevented from occurring, and the manufacturing method thereof, that substantially obviate one or more of the problems caused by the limitations and disadvantages of the related art.

Features and advantages of the present invention will be set forth in the description that follows, and in part will become apparent from the description and the accompanying drawings, or may be learned by practice of the invention according to the teachings provided in the description. Objects as well as other features and advantages of the present invention will be realized and attained by a semiconductor device and a manufacturing method thereof particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides the semiconductor device as follows.

The semiconductor device of the present invention includes a MOS transistor formed on a semiconductor substrate, and a multilayer wiring structure formed on the semiconductor substrate and connected to the MOS transistor. The multilayer wiring structure includes an inter-layer insulating film, a permeable insulating film formed on the surface of the inter-layer insulating film, and a conductive pattern.

The permeable insulating film facilitates discharge of moisture that may be contained in the inter-layer insulating film made of silicon oxide formed by the plasma CVD method and the like. By discharging the moisture to the outside through the permeable insulating film, the moisture is prevented from invading the gate insulating film. Accordingly, the change with time of threshold voltage and degradation with time of the drain saturation current of the MOS transistor are prevented.

Here, the permeable insulating film may be made from silicon carbide that has high moisture permeability and efficiently discharges the moisture, as will be explained later in reference to FIG. 6.

The inter-layer insulating film may be an organic film that has a low dielectric constant.

Alternatively, the inter-layer insulating film can be structured by a lamination of a low dielectric constant organic film and an inorganic insulating film.

The low dielectric constant organic film may be made from a hydrocarbon polymer or fluorinated aromatic polymer that have little moisture content so that the amount of moisture contained in the whole inter-layer insulating film can be reduced, thereby further preventing moisture invasion of the gate insulating film.

A silicon nitride film that covers the side wall insulating film of the gate electrode of the MOS transistor may be formed. Since the silicon nitride film has low moisture permeability, it serves as a barrier layer against the moisture. In this manner, moisture invasion of the gate insulating film can be further prevented.

The conductive pattern is made from a material that contains Cu.

The present invention further includes a manufacturing method of the semiconductor device, the method including a step for forming the inter-layer film and the moisture-permeable film thereon, and a step for heat treatment at a temperature sufficient to discharge moisture contained in the inter-layer insulating film, but not so excessive as to damage the semiconductor device.

DESCRIPTION OF THE PREFERRED EMBODIMENTS

In the following, embodiments of the present invention will be described with reference to the accompanying drawings.

(The First Embodiment)

Figure 1:
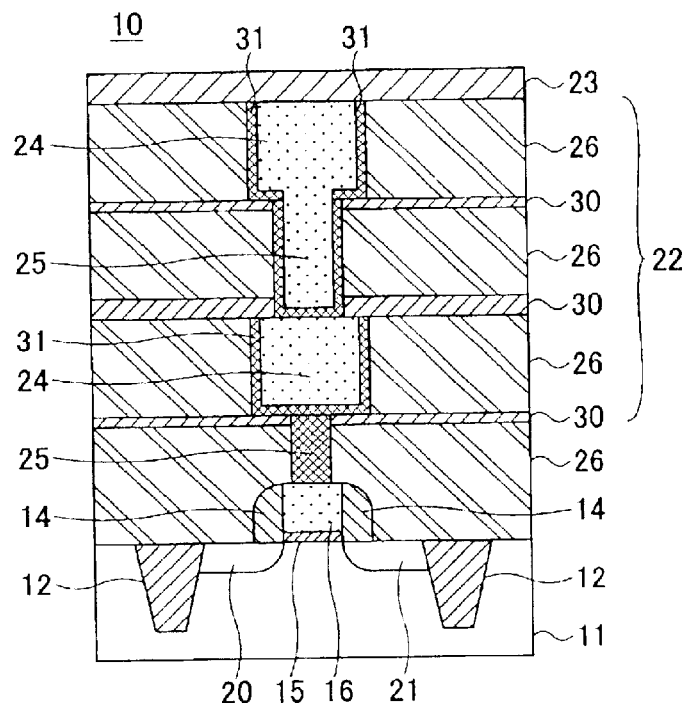
FIG. 1 is a sectional figure showing a MOS device that has a Cu dual damascene structure.
Figure 2:
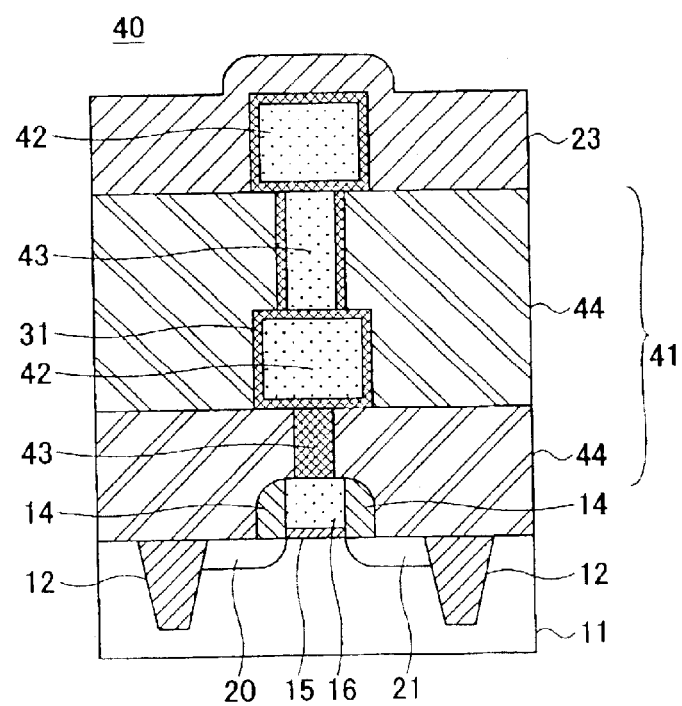
FIG. 2 is a sectional figure showing a MOS device that has an aluminum wiring structure.
Figure 3:
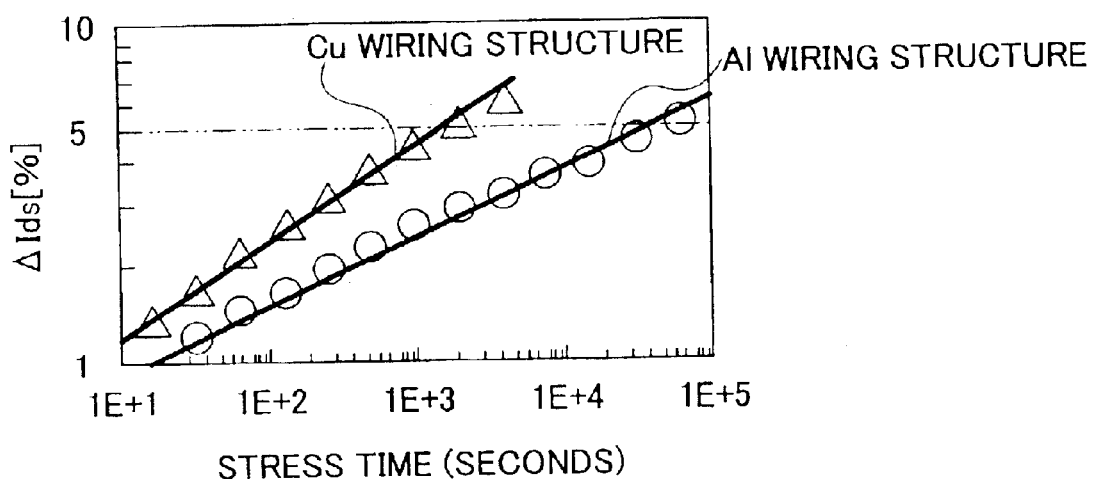
FIG. 3 is a figure showing relations between drain saturation current and stress time in the case of a conventional p-channel MOS transistor.
Figure 4:
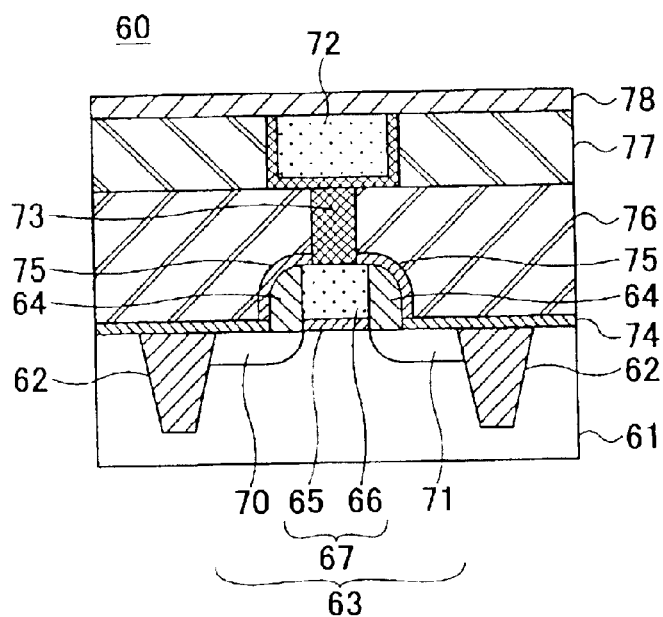
FIG. 4 is a sectional figure showing a MOS device of the first embodiment of the present invention.

FIG. 4 is a sectional figure showing the MOS device 60 of the first embodiment of the present invention, wherein a silicon carbide film is employed as a Cu diffusion prevention layer of the MOS device 60.

With reference to FIG. 4, the MOS device 60 that is formed on a single conductivity type semiconductor substrate 61, for example, an n-type semiconductor substrate, includes a device isolation region 62 formed by an STI process, a device region 63 surrounded by the device isolation region 62, a MOS transistor formed in the device region 63, and a wiring structure connected with the MOS transistor and formed on the semiconductor substrate 61.

The MOS transistor further includes a gate insulating film 65 formed in the device region 63 on the semiconductor substrate 61, a gate electrode 66 formed on the gate insulating film 65, a side wall insulating film 64 supported by the gate electrode 66, a side wall silicon nitride film 75 formed so that the side wall insulating film 64 is covered, and a source region 70 and a drain region 71 formed by diffusing a p-type dopant ion into the semiconductor substrate 61, the p-type dopant ion being the opposite conductivity to the semiconductor substrate 61.

Further, the wiring structure includes a wiring layer 72, a plug 73 that connects the wiring layer 72 and the gate electrode 66, an etching stopper layer 74 formed on the semiconductor substrate 61, a first inter-layer insulating film 76 formed on the gate region 67 (which includes the gate electrode 66 and the gate insulating film 65) and the etching stopper layer 74, a second inter-layer insulating film 77 formed on the first inter-layer insulating film 76, and an inter-layer etching stopper layer 78 formed on the second inter-layer insulating film 77.

For the substrate 61, for example, a single conductivity type semiconductor substrate is used. In the present embodiment, an n-type semiconductor substrate is used. The device isolation region 62 is formed by embedding a silicon oxide film by the well-known STI process.

For the gate insulating film 65 that is 1 nm to 5 nm thick, a silicon oxide film and a silicon oxynitride film, for example, are used. By the scaling law, the gate insulating film 65 is required to be a thin film, and for this purpose, the silicon oxynitride that has a higher specific inductive capacitance than a silicon oxide film is more suitable, because a thin film can be obtained. In the present embodiment, a silicon oxynitride film with a thickness of 2.0 nm is used.

For the gate electrode 66, 50 nm to 250 nm thick poly silicon is used, which is formed by the CVD method, etc. In order to form ohmic contact with the plug 73 on the upper surface of the gate electrode 66, silicide such as TiSi2, CoSi2, and NiSi2 may be formed. In the present embodiment, the gate electrode is formed by poly silicon that is 180 nm thick, using the CVD method.

For the side wall insulating film 64, an undoped silicon oxide film, a silicon oxynitride film, a silicon carbide film, a silicon nitride film, etc. are used. The side wall insulating film 64 is formed such that the gate insulating film 65 and the gate electrode 66 are covered and protected. In the present embodiment, the side wall insulating film 64 consists of an undoped silicon oxide film with a thickness of 130 nm, formed by the CVD method.

To the source region 70 and the drain region 71, p+ is formed by ion implantation of B+, which is a p-type dopant ion, and the like. In the present embodiment, the ion implantation of B+ is performed.

Further, silicide such as TiSi2, CoSi2, and NiSi2 may be formed in the contact region on the surface of the source region 70 and the drain region 71, such that ohmic contact is provided with a source electrode and a drain electrode (not shown). In the present embodiment, CoSi2 is formed in the contact region.

The plug 73 is formed in the slot for the plug 73 by depositing a W film by the CVD, and flattening the W film by the CMP method or etching back, the slot being provided in the first inter-layer insulating film 76. The plug 73 connects the gate electrode 66 to the wiring layer 72. Further, in order to enhance adhesion of the plug 73 to the first inter-layer insulating film 76, an adhesion layer (not shown) that consists of TiN formed by the sputtering method etc. may be formed.

The wiring layer 72 is formed by forming a Cu film into the slot provided in the second inter-layer insulating film 77 by the plating method, the CVD method, etc., and by flattening the Cu film by the CMP method. A metal barrier layer is formed in the inner wall of the slot for preventing Cu from diffusing to the first and the second inter-layer insulating films 76 and 77. The metal barrier layer consists of TaN, TiN, etc., and is formed by the sputtering method, the CVD method, etc.

The side wall silicon nitride film 75 that is 10 nm to 100 nm thick is formed by the sputtering method, the CVD method, etc., such that the side wall insulating film 64 is covered. The silicon nitride film features a minute crystal structure, which is difficult for moisture to penetrate, thus preventing moisture contained in the inter-layer insulating films 76 and 77 from invading into the gate insulating film 65.

For the first inter-layer insulating film 76, a silicon oxide film, an undoped silicon oxide film, a phosphor-doped silicon oxide film, a low dielectric constant insulating film, etc. is used, which is formed by the CVD method, the applying method, etc. As for the low dielectric constant insulating film, an organic insulating film that consists of a hydrocarbon polymer, such as SiLK (a registered trademark of Dow Chemical Co.), and an aromatic polymer of fluoride system, such as FLARE2.0 (a registered trademark of Allied Signal, Inc.), and an inorganic insulating film such as a fluoride-containing silicon oxide film and a carbon-containing silicon oxide film can be used. These low dielectric constant insulating films have higher specific inductive capacitances than a silicon oxide film, and therefore, are suitable for improvement in the speed of the MOS device.

Figure 5:
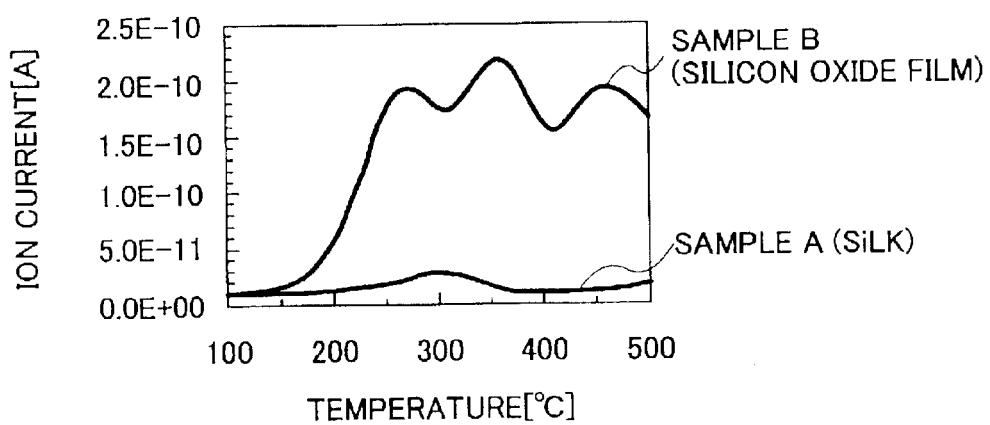
FIG. 5 is a figure showing measurement results of moisture content of a SiLK film and an oxidized silicon film.

Further, the first inter-layer insulating film 76 is preferably composed of an organic insulating film, for example, SILK, FLARE2.0, etc. from a viewpoint of its low moisture content. FIG. 5 shows measurement results of the moisture content of a SILK film and a silicon oxide film, using a TDS (Thermal Desorption Spectroscopy) method. In FIG. 5, the horizontal axis represents temperature that was applied to heat the samples, and the vertical axis represents volume of moisture desorbed from the samples measured by the magnitude of ion current. Sample A for this measurement was composed of a silicon substrate, on which SILK was applied to become 150 nm in thickness, and cured at about 400 degrees C. Sample B was composed of a silicon substrate, on which a silicon oxide film that is 150 nm thick was formed by the plasma CVD method. Dimensions of the samples were set to 10 mm×10 mm. Further, as the measurement conditions, the degree of vacuum was set at $1\times10^{-7}$ Pa, and the temperature rising speed was set at 6-degrees-C/minute.

With reference to FIG. 5, the volume of the moisture desorbed from Sample B starts to increase from about 200 degrees C., and the desorption volume peaks at 350 degrees C., where the desorption volume is about 20 times as large as at 100 degrees C. In contrast, as for Sample A, the moisture desorption is much less than sample B, although the volume of the moisture desorbed peaks at 300 degrees C., where the volume is about 3 times as large as at 100 degrees C. As the measurement result shows, the moisture content of SiLK, i.e., Sample A, is far less than the silicon oxide film formed by the plasma CVD method.

In reference to FIG. 4 again, the first inter-layer insulating film 76 of the present embodiment is composed of a phosphorated silicon oxide film (PSG film) that is 600 nm thick, and formed by the plasma CVD method.

The second inter-layer insulating film 77 is composed of the same material as the first inter-layer insulating film 76. In the present embodiment, a silicon oxide film with a thickness of 250 nm, formed by the plasma CVD method, is used.

The inter-layer etching stopper layer 78 consists of a permeable insulation layer with a thickness of 30 nm–150 nm, which is formed by the CVD method, the sputtering method, etc. The permeable insulation layer consists of an undoped silicon oxide film, a silicon oxynitride film, a silicon carbide film, etc. It is desirable that the inter-layer etching stopper layer 78 consists of the silicon carbide film. The silicon carbide film is formed by the plasma CVD method under process conditions of RF power being 100W to 2000W, process pressure being 100 Pa to 700 Pa, process gas being tetra methyl silane $(Si(CH_3)_4)$ and carbon dioxide $(CO_2)$, and substrate temperature being 300 to 450 degrees C.

Figure 6:
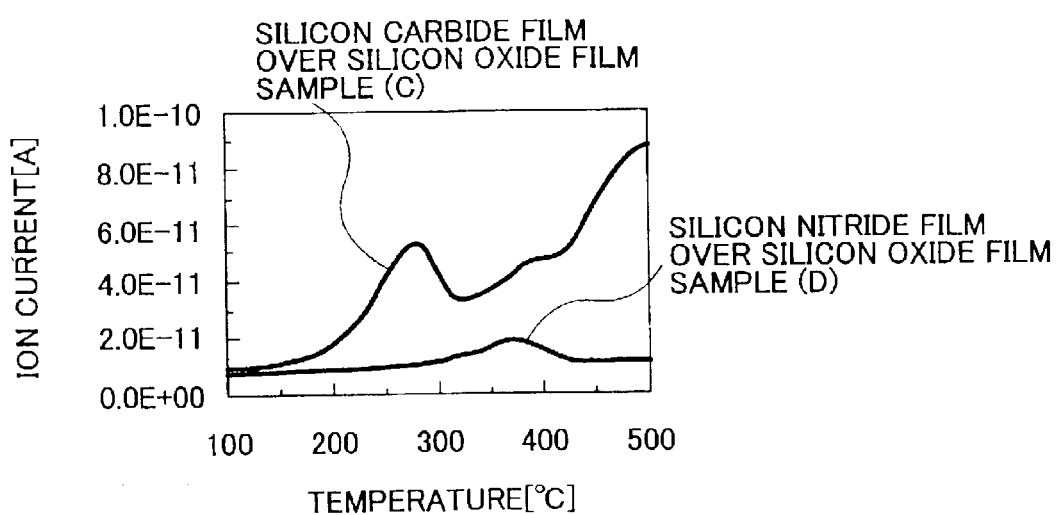
FIG. 6 is a figure showing comparisons of moisture permeability of a silicon carbide film and a silicon nitride film.

FIG. 6 offers comparison of the moisture permeability of a silicon carbide film and a silicon nitride film. In FIG. 6, the horizontal axis shows the temperature to which the samples are heated in the TDS method. Further, the vertical axis shows the volume of the moisture desorbed from the samples measured by the magnitude of ion current. Sample C was made by forming a 250 nm thick silicon oxide film by the plasma CVD method on a silicon substrate, and by further forming a 70 nm thick silicon carbide film, covering the whole surface of the silicon oxide film by the CVD method. Sample D is the same as Sample C, except that the last film is a silicon nitride film. The dimensions of the samples were set to 10 mm×10 mm. Measurement conditions are the same as explained in respect of FIG. 5.

With reference to FIG. 6, Sample D shows a small peak near 380 degree C., however, the volume of the moisture desorbed is nearly the same as the case of 100 degrees C. In contrast, the amount of the ions increases in the case of Sample C from about 200 degree C., and peaks at approximately 280 degree C. with the desorbing volume of about 6 times as compared with 100 degrees C., and further increases to about 9 times at 500 degrees C. The desorbed moisture that was measured is the moisture contained in the silicon oxide film, and desorbed through the silicon carbide film and the silicon nitride film, respectively. Since the amount of the moisture contained in the silicon oxide film is the same for the two samples, the measurement results show that the moisture permeability of the silicon carbide film of Sample C is far better than the silicon nitride film of Sample D.

In reference to FIG. 4 again, the inter-layer etching stopper layer 78 of the present embodiment is composed of the silicon carbide film with a thickness of 70 nm, formed by the plasma CVD method.

(The Second Embodiment)

The second embodiment is the same as the first embodiment, the only difference being that the second inter-layer insulating film consists of two layers.

Figure 7:
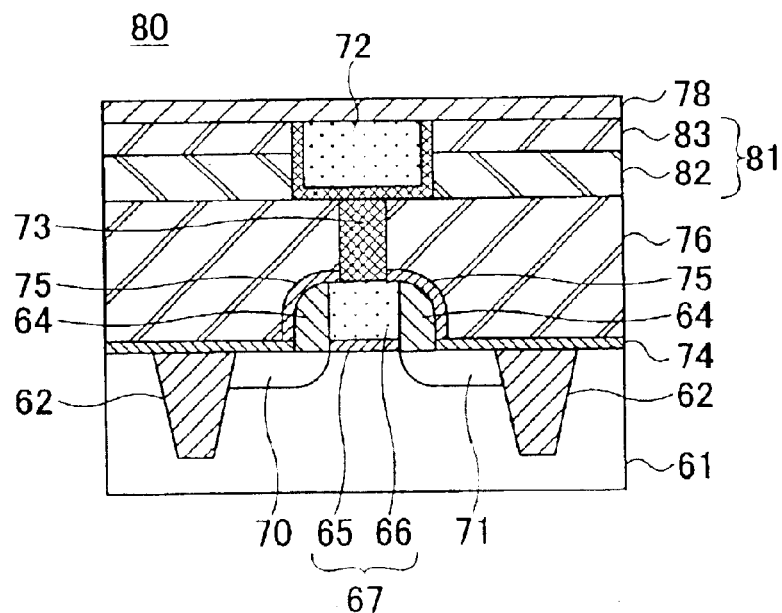
FIG. 7 is a sectional figure showing the MOS device of the second embodiment of the present invention.

FIG. 7 is a sectional view showing the MOS device of the second embodiment. In FIG. 7, the same reference numbers are given to the same elements that are previously explained, and explanations thereof are not repeated.

With reference to FIG. 7, the second inter-layer insulating film 81 consists of two layers, namely, a lower layer 82, and an upper layer 83. The lower layer 82 consists of SiLK with a thickness of 150 nm formed by an application method. Curing is carried out at a temperature of about 350 degrees C. after the application. Further, for the upper layer, a silicon oxide film with a thickness of 100 nm formed by the plasma CVD method is used.

In order to facilitate comparisons of the embodiments of the present invention with other implementations, two comparative samples, a first comparative sample and a second comparative sample, which are not according to the present invention, were prepared.

The first comparative sample of the MOS device is the same as the first embodiment of the present invention, except that the inter-layer etching stopper layer 78 of the first comparative sample is constituted by a silicon nitride film instead of the silicon carbide film as practiced by the first embodiment.

The silicon nitride film of the first comparative sample was formed in a thickness of 70 nm, and by the CVD method.

The second comparative sample of the MOS device is the same as the second embodiment of the present invention, except that the inter-layer etching stopper layer 78 of the second comparative sample is constituted by a silicon nitride film instead of the silicon carbide film as practiced by the second embodiment.

The silicon nitride film of the second comparative sample was formed in a thickness of 70 nm, and by the CVD method.

Figure 8:
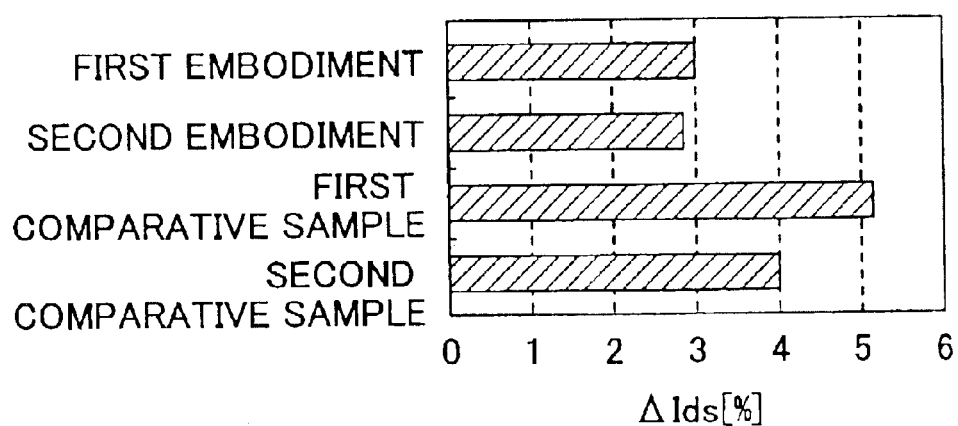
FIG. 8 is a figure showing degradation with time of the drain saturation current in the cases of the embodiments of the present invention and comparative samples.

FIG. 8 is a figure showing degradation with time of the drain saturation current ΔIds of the embodiments and the comparative samples. FIG. 8 shows results after stress time of 4096 seconds, with the gate voltage kept constant. As evident from FIG. 8, the first and the second embodiments are less susceptible to degradation of the drain saturation current than the two comparative examples. Especially, the degradation of the drain saturation current of the second embodiment that used SiLK with low moisture content was the least.

As described above, according to the first and the second embodiments, the inter-layer etching stopper layer 78 is constituted by the permeable silicon carbide film, wherein the moisture contained in the silicon oxide film, which serves as the inter-layer insulating film, is spread in the whole MOS device through a manufacturing process of the MOS device, or by energization. However, since the silicon carbide film prepared in the inter-layer etching stopper layer 78 has high moisture permeability, the moisture is discharged to outside of the MOS device. Therefore, moisture invasion into the gate insulating film is prevented from occurring, and the degradation of the drain saturation current with time is suppressed.

Furthermore, according to the second embodiment, since the inter-layer insulating film having a low moisture content is used as a part of the second inter-layer insulating film, the degradation of the drain saturation current with time is further suppressed.

In the following, the manufacturing process of the semiconductor device of the present invention is explained.

Figure 9:
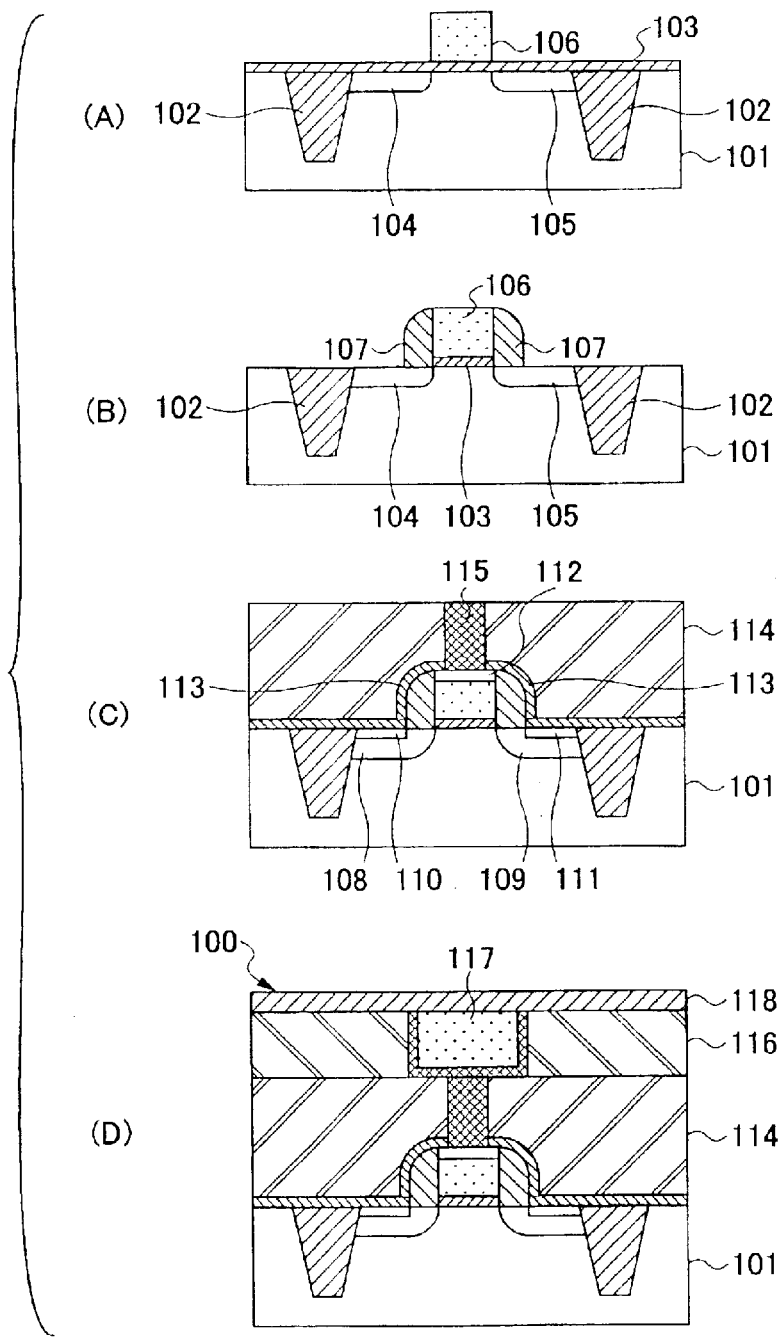
FIG. 9 shows a manufacturing process of a p-channel MOS device, the process being divided into subsections (A) through (D).

FIG. 9 shows the manufacturing process of a p-channel MOS device.

With reference to a FIG. 9, the section marked (A) shows a formation of a device isolation region 102 in a substrate 101 of an n-type single conductivity semiconductor according to the well-known STI process. Next, the substrate 101 is heated, for example, in an $N_2$ atmosphere to a temperature between 700 degrees C. and 900 degrees C., such that a gate insulating film 103 consisting of a 1 to 5 nm thick silicon oxide film is formed on the surface of the substrate 101. The gate insulating film 103 may be formed using an oxidizing gas such as NO, $N_2O$, and dry $O_2+NH_3$ instead of $N_2$, in which case, a silicon oxynitride film is formed. Next, by ion implantation, B+ that is a dopant ion is implanted in the substrate 101, and extension regions 104 and 105 of a source and a drain, respectively, are formed. Next, a 50 nm–250 nm thick poly silicon film is formed by the CVD method etc. Photo resist is applied, which is then patterned, and dry etching is carried out, with the photo resist that remains serving as a mask, and a gate electrode 106 is formed.

Next, with reference to the section marked (B) in FIG. 9, a silicon oxide film that is about 130 nm thick, and has step coverage is formed by the CVD method etc. on the substrate (not shown). Next, an anisotropy etching by RTE (reactant ion etching) is carried out until the gate electrode 106 is exposed. A side wall insulating film 107 consisting of a silicon oxide film is formed on the side of the gate insulating film 103 and the gate electrode 106.

With reference to the section (C) of FIG. 9, B+ that is a dopant ion is implanted in the substrate, and a source region 108 and a drain region 109 are formed. On the surface of the substrate, a film (not shown) that consists of Ti, Co, or nickel with a thickness of about 10 nm is formed by the sputtering method, etc. Next, annealing at about 540 degrees C. in an N2 atmosphere is carried out. By this annealing, silicides (TiSi2, CoSi2, NiSi2) 110, 111, and 112 are formed in the portions where the film of Ti, Co, or nickel, and the silicon and poly silicon on the surface of the substrate contact each other. The silicide 112 and a plug 115 (described later) make ohmic contact. Next, the film of Ti, Co, or nickel is removed by a wet process. Next, a side wall silicon nitride film 113 constituted by a 10 nm–100 nm thick silicon nitride film is formed on the surface of the substrate. The side wall silicon nitride film 113 covers the side wall insulating film, such that moisture invasion into the gate insulating film 103 is prevented from occurring, since the silicon nitride film is not moisture-permeable. Next, on the side wall silicon nitride film 113, a first inter-layer insulating film 114 that is 400 nm–1000 nm thick is formed by the CVD method etc., which is a PSG film. Next, the first inter-layer insulating film 114 is flattened by the CMP method. Next, photo resist is patterned on the first inter-layer insulating film 114 by the photo lithography method. Then, dry etching, using the photo resist as a mask, removes the first inter-layer insulating film 114 and the side wall silicon nitride film 113 that are immediately above the gate electrode 106, and a contact hole is formed. Next, by the CVD method, a tungsten (W) film is formed and embedded in the contact hole. Then, the surface of the W film is polished by the CMP method, a flat surface that consists of a PSG film and a W film is formed, and a plug 115 is formed.

In reference to the section (D) of FIG. 9, SiLK is applied on the first inter-layer insulating film 114 and the plug 115 for a thickness of about 150 nm by an application method, a cure at about 400 degrees C. is carried out, and a second inter-layer insulating film 116 consisting of SiLK is formed. Next, photo resist is patterned on the second inter-layer insulating film 116 by the photo lithography method, a slot of a wiring layer is formed by dry etching, using the remaining photo resist as a mask. Next, a Cu film with a thickness of 1000 nm is formed by the vacuum evaporation method, the CVD method, the plating method, etc., such that the slot of the wiring layer is filled. Next, the Cu film is polished and flattened by the CMP method, and the wiring layer 117 is formed.

Next, an insulated layer etching stopper film 118 is formed. The insulated layer etching stopper film 118 consists of a silicon carbide film, which is formed by the plasma CVD method under processing conditions of RF power being 100W to 2000W, process pressure being 100 Pa to 700 Pa, process gas being tetra methyl silane ($Si(CH_3)_4$) and carbon dioxide ($CO_2$), and temperature of the substrate being 300 to 450 degrees C.

Next, the substrate is heat-treated at a temperature higher than 200 degrees C. For example, sintering is carried out at a temperature of 400 to 500 degrees C. in an $H_2$ atmosphere. The sintering terminates dangling bonds on the substrate surface, etc., with hydrogen, and discharges moisture in the inter-layer insulating film.

In this manner, the p-channel MOS device 100 is manufactured. Here, the case where there is one wiring layer 117 is explained. However, when the wiring layer 117 is multilayered, it is desirable that an inter-layer etching stopper film 118 be formed by a permeable insulating film, such as a silicon carbide film, on the surface of each inter-layer insulating film. In this manner, the moisture in the inter-layer insulating film can be discharged outside through the inter-layer insulating film and the silicon carbide film. Furthermore, it is also desirable that a passivation layer be formed on the topmost surface of the MOS device with a permeable insulating film, for example, a silicon carbide film.

In addition, although the p-channel MOS transistor is explained, the present invention is also applicable to an n-channel MOS transistor with an appropriate translation.

Further, although the second embodiment of the present invention is explained as the second inter-layer insulating film consisting of two layers, three or more layers may be provided, and the first inter-layer insulating film may consist of two or more layers.

Further, although the number of wiring layers in the first and the second embodiments of the present invention is one, the number of wiring layers may be two or higher.

As evident from descriptions above, according to the present invention, the moisture that is contained in the inter-layer insulating film of the silicon oxide film is made to be easily discharged to the outside, preventing the moisture from invading the gate insulating film, by covering the surface of the inter-layer insulating film that constitutes the multilayer wiring structure of the semiconductor device with the permeable insulating film. Consequently, the present invention prevents the change with time of the threshold voltage of the MOS transistor and degradation of the drain saturation current with time from occurring.

Although the preferred embodiments of the present invention are explained in full detail above, the present invention is not limited to these embodiments, but various variations and modifications may be made without departing from the scope of the present invention.

What is claimed is:

1. A semiconductor device, comprising
   a MOS transistor formed an a semiconductor substrate, and
   a multilayer wiring structure formed on the semiconductor substrate and connected to the MOS transistor, wherein the multilayer wiring structure further comprises
   an inter-layer insulating film,
   a conductive pattern formed in the inter-layer insulating film, and
   a permeable insulating film formed on the surface of the inter-layer insulating film,
   wherein the permeable insulating film is a silicon carbide film.

2. The semiconductor device as claimed in claim 1, wherein the conductive pattern contains Cu.

3. A semiconductor device, comprising
   a MOS transistor formed on a semiconductor substrate, and
   a multilayer wiring structure formed on the semiconductor substrate and connected to the MOS transistor, wherein the multilayer wiring structure further comprises
   an inter-layer insulating film,
   a conductive pattern formed in the inter-layer insulating film, and
   a permeable insulating film formed on the surface of the inter-layer insulating film,
   wherein the inter-layer insulating film is a low dielectric constant organic film.

4. The semiconductor device as claimed in claim 3, wherein the low dielectric constant organic film is made from one of a hydrocarbon polymer and a fluorinated aromatic polymer.

5. A semiconductor device, comprising
   a MOS transistor formed on a semiconductor substrate, and
   a multilayer wiring structure formed on the semiconductor substrate and connected to the MOS transistor, wherein the multilayer wiring structure further comprises
   an inter-layer insulating film,
   a conductive pattern formed in the inter-layer insulating film, and
   a permeable insulating film formed on the surface of the inter-layer insulating film,
   wherein the inter-layer insulating film comprises a layer of a low dielectric constant organic film and an inorganic insulating film.

6. A semiconductor device, comprising
   a MOS transistor formed on a semiconductor substrate, and
   a multilayer wiring structure formed on the semiconductor substrate and connected to the MOS transistor, wherein the multilayer wiring structure further comprises
   an inter-layer insulating film,
   a conductive pattern formed in the inter-layer insulating film, and
   a permeable insulating film formed on the surface of the inter-layer insulating film,
   wherein a silicon nitride film is formed such that a side wall insulating film of a gate electrode of the MOS transistor is covered.

* * * * *